(12) United States Patent
Yuan

(10) Patent No.: US 11,937,467 B2
(45) Date of Patent: Mar. 19, 2024

(54) ELECTRONIC DEVICE AND DISPLAY APPARATUS

(71) Applicant: GUANGDONG OPPO MOBILE TELECOMMUNICATIONS CORP., LTD., Guangdong (CN)

(72) Inventor: Shilin Yuan, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 74 days.

(21) Appl. No.: 17/381,415

(22) Filed: Jul. 21, 2021

(65) Prior Publication Data
US 2021/0351258 A1 Nov. 11, 2021

Related U.S. Application Data

(63) Continuation of application No. PCT/CN2020/073029, filed on Jan. 19, 2020.

(30) Foreign Application Priority Data

Feb. 1, 2019 (CN) .......................... 201910105329.7

(51) Int. Cl.
*H10K 59/126* (2023.01)
*H04M 1/02* (2006.01)
(Continued)

(52) U.S. Cl.
CPC ........ *H10K 59/126* (2023.02); *H04M 1/0264* (2013.01); *H04M 1/0266* (2013.01);
(Continued)

(58) Field of Classification Search
CPC ... H04N 23/57; H04M 1/0264; H10K 59/126; H10K 59/65
(Continued)

(56) References Cited

U.S. PATENT DOCUMENTS

| 9,870,024 | B2 * | 1/2018 | Evans, V | .............. H01L 27/323 |
| 2014/0027735 | A1 * | 1/2014 | Kim | ........................ H01L 51/56 257/40 |

(Continued)

FOREIGN PATENT DOCUMENTS

| CN | 204480626 U | 7/2015 |
| CN | 107797331 A | 3/2018 |

(Continued)

OTHER PUBLICATIONS

Extended European search report issued in corresponding European application No. 20748879.2 dated Feb. 25, 2022. 9 pages.
(Continued)

*Primary Examiner* — Anthony J Daniels
(74) *Attorney, Agent, or Firm* — Perkins Coie LLP

(57) ABSTRACT

An electronic device includes a display apparatus and a camera. The display apparatus includes a first substrate, a driving circuit layer, a pixel definition layer, a common electrode layer, a second substrate, a capping layer and at least a light shielding block. The camera is at least partially disposed corresponding to the plurality of pixel holes and is configured to acquire image through the display apparatus. The light shielding block is configured to shield the ambient light when the camera acquires image.

18 Claims, 8 Drawing Sheets

(51) Int. Cl.
*H04N 23/57* (2023.01)
*H10K 50/844* (2023.01)
*H10K 59/122* (2023.01)

(52) U.S. Cl.
CPC ........... *H04N 23/57* (2023.01); *H10K 50/844* (2023.02); *G09G 2300/0426* (2013.01); *G09G 2354/00* (2013.01); *H04M 2250/52* (2013.01); *H10K 59/122* (2023.02)

(58) Field of Classification Search
USPC ..................................................... 348/207.99
See application file for complete search history.

(56) References Cited

U.S. PATENT DOCUMENTS

| | | | |
|---|---|---|---|
| 2017/0372113 A1 | 12/2017 | Zhang et al. | |
| 2019/0123112 A1* | 4/2019 | Lee | G06F 3/0445 |
| 2019/0213379 A1 | 7/2019 | Zhao et al. | |
| 2019/0245026 A1* | 8/2019 | Woo | G06F 3/0446 |
| 2020/0135148 A1* | 4/2020 | Bai | G09G 3/20 |
| 2020/0258946 A1* | 8/2020 | Kim | H01L 51/5253 |

FOREIGN PATENT DOCUMENTS

| | | | |
|---|---|---|---|
| CN | 107978624 A | 5/2018 | |
| CN | 108288681 A | 7/2018 | |
| CN | 108551545 A | 9/2018 | |
| CN | 108828817 A | 11/2018 | |
| CN | 108885376 A | 11/2018 | |
| CN | 208256675 U | 12/2018 | |
| CN | 109143648 A | 1/2019 | |
| CN | 109147595 A | 1/2019 | |
| CN | 109148528 A | 1/2019 | |
| EP | 3012865 A1 | 4/2016 | |
| JP | 2018170510 A | 11/2018 | |
| KR | 10-2017-0029037 | * 3/2017 | ........... H01L 27/326 |

OTHER PUBLICATIONS

The first office action issued in corresponding CN application No. 201910105329.7 dated Oct. 9, 2020.
The second office action issued in corresponding CN application No. 201910105329.7 dated Mar. 2, 2021.
International search report issued in corresponding international application No. PCT/CN2020/073029 dated Apr. 9, 2020.
Notice of allowance issued in corresponding CN application No. 201910105329.7 dated Jun. 29, 2021.

* cited by examiner

ELECTRONIC DEVICE AND DISPLAY APPARATUS

CROSS-REFERENCE TO RELATED APPLICATION

This application is a continuation of International patent application No. PCT/CN2020/073029, filed Jan. 19, 2020, which claims the right of priority of Chinese patent application No. 201910105329.7, filed on Feb. 1, 2019, both applications are hereby incorporated by reference in their entireties.

TECHNICAL FIELD

This present disclosure relates to electronic technology, and more particular, to an electronic device and a display apparatus.

BACKGROUND

With the development of communication technology, electronic devices such as smart phones are becoming more and more popular. While using the electronic device, the electronic device can display contents on its screen.

SUMMARY

The embodiments of the present disclosure provide an electronic device and a display apparatus.

An embodiment of the disclosure provides an electronic device, which includes a display apparatus and a camera. The display apparatus includes a first substrate, a driving circuit layer, a pixel definition layer, a common electrode layer, a second substrate, a capping layer and at least a light shielding block.

The driving circuit layer is positioned on the first substrate and includes a plurality of thin film transistors in an array. The pixel definition layer is disposed on a side of the driving circuit layer away from the first substrate and includes a plurality of pixel holes in an array. Each pixel hole receives an organic light emitter and each of the organic light emitters is correspondingly connected to one thin film transistor. The common electrode layer is disposed on a side of the pixel definition layer away from the driving circuit layer. The second substrate is disposed on a side of the common electrode layer away from the pixel definition layer. The capping layer is disposed between the second substrate and the common electrode layer. The light shielding block is disposed between the second substrate and one of the organic light emitters, and the light shielding block is at least partially corresponding to one of the thin film transistors.

The camera is at least partially disposed corresponding to the pixel hole and is configured to acquire images through the display apparatus. The light shielding block is configured to shield ambient light irradiating to the thin film transistor when the camera acquires image.

The embodiment of the present disclosure also provides a display apparatus. The display apparatus includes a first substrate, a driving circuit layer, a pixel definition layer, a common electrode layer, a second substrate and a capping layer.

The driving circuit layer is positioned on the first substrate and includes a plurality of thin film transistors in an array. The pixel definition layer is disposed on a side of the driving circuit layer away from the first substrate and includes a plurality of pixel holes in an array. Each pixel hole receives an organic light emitter and each of the organic light emitters is correspondingly connected to one thin film transistor. The common electrode layer is disposed on a side of the pixel definition layer away from the driving circuit layer. The second substrate is disposed on a side of the common electrode layer away from the pixel definition layer. The capping layer is disposed between the second substrate and the common electrode layer.

The display apparatus defines a body area and a light transmitting area. The light transmitting area is at least partially surrounded by the body area. In the light transmitting area, a light shielding blocks are disposed between the second substrate and one of the organic light emitters. The light shielding block is at least partially disposed corresponding to one of the thin film transistors.

The embodiment of the present disclosure also provides an electronic device. The electronic device includes a display apparatus and a camera. The display apparatus includes a body area and a light transmitting area. The body area includes a plurality of first thin film transistors. The light transmitting area includes a plurality of second thin film transistors and at least a light shielding block. The density of the second thin film transistors is less than that of the plurality of first thin film transistors. The light shielding block is at least partially corresponding to one of the second thin film transistors.

The camera is positioned corresponding to the light transmitting area. The camera is configured to receive light passing though the light transmitting area to acquire image. The light shielding block is configured to shield ambient light irradiating toward the thin film transistor when the camera acquires image.

BRIEF DESCRIPTION OF THE DRAWINGS

In order to more clearly make the technical solution described in the embodiments of the present disclosure, the drawings used for the description of the embodiments will be briefly described.

DETAILED DESCRIPTION

Figure 1:
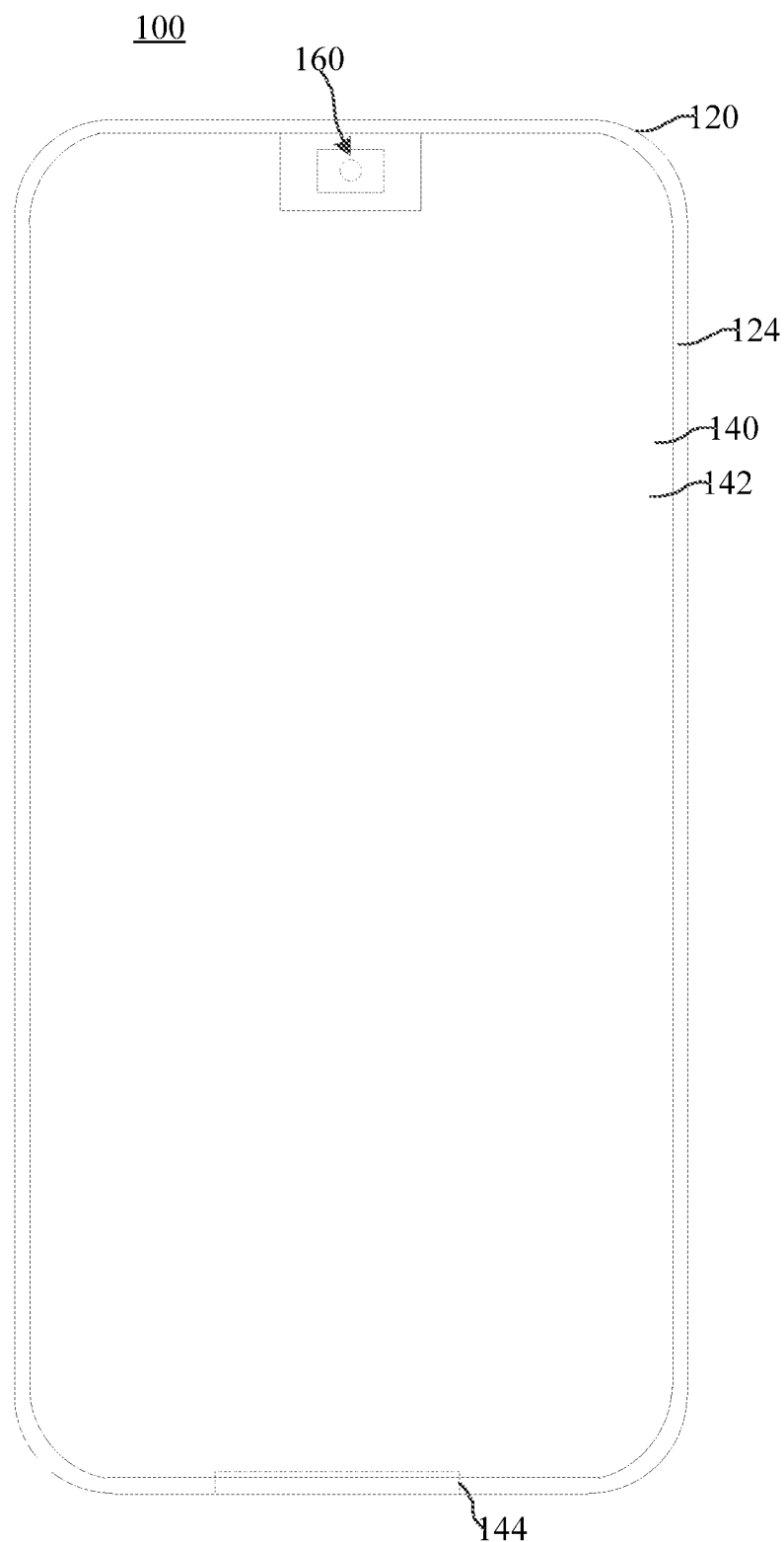
FIG. 1 is a first structure schematic diagram of an electronic device according to an embodiment of the disclosure.

Technical solutions of the embodiments of the present disclosure may be clearly and comprehensively described by referring to accompanying figures of the embodiments. Obviously, described embodiments are only a part of, but not all of, the embodiments of the present disclosure. Any ordinary skilled person in the art may obtain other embodiments based on the embodiments of the present disclosure without any creative work, and the other embodiments should be included in the scope of the present disclosure.

An embodiment of the present disclosure provides an electronic device, which includes a display apparatus and a camera. The display apparatus includes a first substrate, a driving circuit layer, a pixel definition layer, a common electrode layer, a second substrate, a capping layer and at least a light shielding block.

The driving circuit layer is positioned on the first substrate and includes a plurality of thin film transistors in an array. The pixel definition layer is disposed on a side of the driving circuit layer away from the first substrate and includes a plurality of pixel holes in an array. Each pixel hole receives an organic light emitter and each of the organic light emitters is connected to one thin film transistor. The common electrode layer is disposed on a side of the pixel definition layer away from the driving circuit layer. The second substrate is disposed on a side of the common electrode layer away from the pixel definition layer. The capping layer is disposed between the second substrate and the common electrode layer. The light shielding block is disposed between the second substrate and one of the organic light emitters, and the light shielding block is at least partially corresponding to one thin film transistor. The camera is at least partially disposed corresponding to the pixel hole and is configured to acquire images through the display apparatus, and the light shielding block is configured to shield ambient light irradiating to the thin film transistor when the camera acquires image.

In some embodiments, the light shielding blocks are disposed on the capping layer.

In some embodiments, the capping layer has a plurality of first through holes, each of the first through holes is disposed corresponding to one thin film transistor, and the light shielding block is disposed in one first through hole.

In some embodiments, the capping layer has a plurality of first grooves, each of the first grooves is disposed corresponding to one thin film transistor, and the opening of each of the first grooves faces to the first substrate or the second substrate, the light shielding block is disposed in one first groove.

In some embodiments, the display apparatus further includes a filling layer disposed on a side of the common electrode layer away from the pixel definition layer, and the filling layer includes a plurality of filling bodies, and each of the filling bodies is disposed corresponding to one pixel hole, and the difference of a refractive index of the pixel definition layer and the filling layer is smaller than the difference of a refractive index of the pixel definition layer and the vacuum.

In some embodiments, the common electrode layer has a plurality of second grooves, the openings of the plurality of second grooves face the second substrate, and each of the second grooves is disposed corresponding to one pixel hole, and each of the filling bodies is disposed in one second groove.

In some embodiments, the capping layer has a plurality of third grooves, and the openings of the plurality of third grooves face the second substrate, and each of the third grooves is disposed corresponding to one pixel hole, and each of the filling bodies is disposed in one third groove.

In some embodiments, the light shielding block has a first projection on the first substrate, and the thin film transistor has a second projection on the first substrate, and the second projection is within the first projection.

In some embodiments, the electronic device further includes a processor, and both the display apparatus and the camera are electrically connected to the processor. When receiving a shooting instruction, the processor controls the display apparatus to turn off the display, and controls the camera to acquire images through the display apparatus; and when receiving an image display instruction, the processor controls the display apparatus to display the image.

The embodiment of the present disclosure also provides a display apparatus. The display apparatus includes a first substrate, a driving circuit layer, a pixel definition layer, a common electrode layer, a second substrate and a capping layer.

The driving circuit layer is positioned on the first substrate and includes a plurality of thin film transistors in an array. The pixel definition layer is disposed on a side of the driving circuit layer away from the first substrate and includes a plurality of pixel holes in an array. Each pixel hole receives an organic light emitter and each of the organic light emitters is connected to one thin film transistor. The common electrode layer is disposed on a side of the pixel definition layer away from the driving circuit layer. The second substrate is disposed on a side of the common electrode layer away from the pixel definition layer. The capping layer is disposed between the second substrate and the common electrode layer.

The display apparatus defines a body area and a light transmitting area. The light transmitting area is at least partially surrounded by the body area. In the light transmitting area, a light shielding blocks are disposed between the second substrate and one of the organic light emitters. Each of the light shielding blocks are at least partially disposed corresponding to one thin film transistor.

In some embodiments, the light shielding blocks are disposed on the capping layer.

In some embodiments, the capping layer has a plurality of first through holes, each of the first through holes is disposed corresponding to one thin film transistor, and each of the light shielding blocks are disposed in one first through hole.

In some embodiments, the capping layer has a plurality of first grooves, each of the first grooves is disposed corresponding to one thin film transistor, and the opening of each of the first grooves faces to the first substrate or the second substrate, and each of the light shielding blocks are disposed in one first groove.

In some embodiments, the display apparatus further includes a filling layer disposed on a side of the common electrode layer away from the pixel definition layer, and the filling layer includes a plurality of filling bodies, and each of the filling bodies is disposed corresponding to one pixel hole, and the difference of a refractive index of the pixel definition layer and the filling layer is smaller than the difference of a refractive index of the pixel definition layer and the vacuum.

In some embodiments, the common electrode layer has a plurality of second grooves, the openings of the plurality of second grooves face the second substrate, and each of the second grooves is disposed corresponding to one pixel hole, and each of the filling bodies is disposed in one second groove.

In some embodiments, the capping layer has a plurality of third grooves, and the openings of the plurality of third grooves face the second substrate, and each of the third grooves is disposed corresponding to one pixel hole, and each of the filling bodies is disposed in one third groove.

In some embodiments, the area of the light-transmitting area is smaller than the area of the body area, and the light transmittance of the light transmitting area is greater than the light transmittance of the body area.

In some embodiments, the distribution density of the pixel holes in the light transmitting area is less than the distribution density of the pixel holes in the body area.

In some embodiments, the display apparatus includes a first display panel and a second display panel, the first display panel is disposed with a notch, and the notch is in the first display panel, and the notch penetrates the first display panel in the thickness direction of the first display panel, and the second display panel is disposed in the notch; and the first display panel is the body area, and the second display panel is the light transmitting area.

In some embodiments, the light shielding block has a first projection on the first substrate, and the thin film transistor has a second projection on the first substrate, and the second projection is within the first projection.

The embodiment of the present disclosure also provides an electronic device. The electronic device includes a display apparatus and a camera. The display apparatus includes a body area and a light transmitting area. The body area includes a plurality of first thin film transistors. The light transmitting area includes a plurality of second thin film transistors and at least a light shielding block, the density of the second thin film transistors being less than that of the plurality of first thin film transistors, the light shielding block being at least partially corresponding to one of the second thin film transistors.

The camera is positioned corresponding to the light transmitting area. The camera is configured to receive light passing though the light transmitting area to acquire image. The light shielding block is configured to shield ambient light irradiating to the thin film transistors when the camera acquires image.

In some embodiments, the electronic device further includes a processor, and both the display apparatus and the camera are electrically connected to the processor. When receiving a shooting instruction, the processor controls the light transmitting area to turn off the display, and controls the camera to acquire images through the light transmitting area. When the shooting instruction is not received and an image display instruction is received, the processor controls the light transmitting area and the body area to cooperatively display the images.

FIG. 1 is a first structure schematic diagram of an electronic device 100 according to an embodiment of the disclosure. The electronic device 100 includes a housing 120, a display apparatus 140, and a camera 160. The display apparatus 140 includes a display panel 142 and a driving circuit 144. The driving circuit 144 is configured to drive the display panel 142 to display various images. The display apparatus 140 is positioned on the housing 120. The housing 120 may include a back cover and a frame 124. The frame 124 surrounds a periphery of the back cover. The display apparatus 140 is disposed in the frame 124. The display apparatus 140 and the back cover can be two corresponding sides of the electronic device 100.

The camera 160 is disposed between the back cover of the housing 120 and the display apparatus 140. The camera 160 includes an image capturing surface for capturing images, and the display apparatus 140 includes a display surface and a display back surface corresponding to the display surface. The image capturing surface of the camera 160 faces the display back surface of the display apparatus 140. The camera 160 is configured to capture optical signal transmitting through the display apparatus 140 and obtain the image based on the captured optical signal. In some embodiments, the camera 160 can be configured as a front camera of the electronic device 100, and the camera 160 can obtain images such as a selfie of the user through the display apparatus 140.

In order to obtain a larger screen duty ratio, a camera of an electronic device can be positioned under the display apparatus, and the camera can obtain the optical signal transmitted through the display apparatus and imaging There are opaque thin film transistors in the display apparatus, when ambient light irradiates on the thin film transistors, scattered light of various angles will be formed, which will eventually enter the camera after a complex reflection, thereby reducing the quality of imaging of the camera which is under display apparatus.

Figure 2:
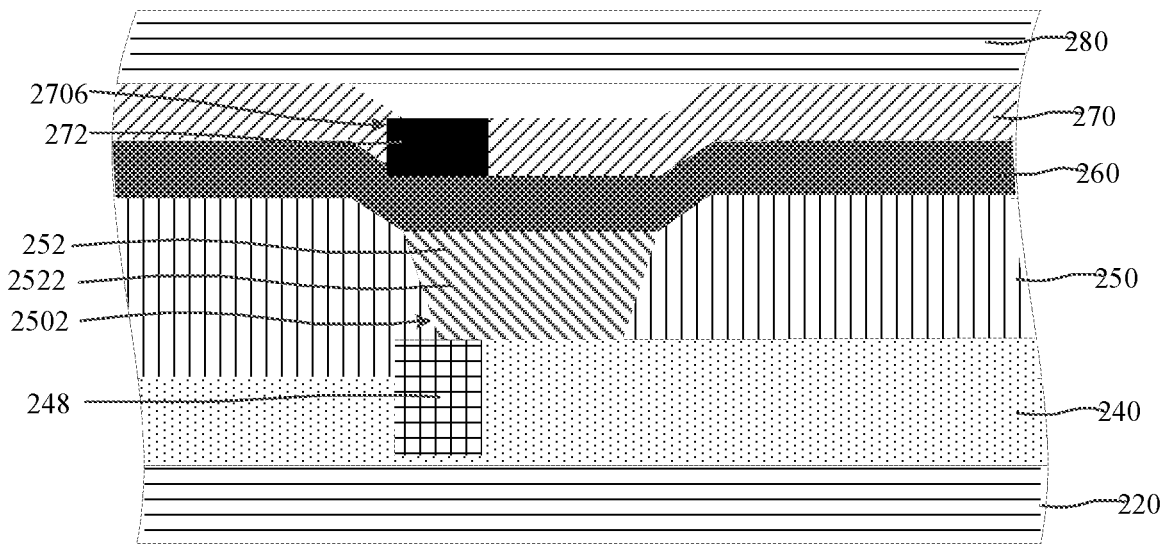
FIG. 2 is a first structure schematic diagram of a display apparatus according to an embodiment of the disclosure.

FIG. 2 is a first structure schematic diagram (e.g., partial cross-sectional view) of the display apparatus 140 of the electronic device 100 in FIG. 1. The display apparatus 140 includes a first substrate 220, a pixel definition layer 250, a common electrode layer 260, a capping layer 270, and a second substrate 280.

In some embodiments, the first substrate 220, the pixel definition layer 250, the common electrode layer 260, the capping layer 270 and the second substrate 280 are stacked in turn.

A driving circuit layer 240 is disposed between the first substrate 220 and the pixel definition layer 250. The driving circuit layer 240 includes a plurality of thin film transistors 248 in an array. The pixel definition layer 250 is disposed on the side of the driving circuit layer 240 away from the first substrate 220. The pixel definition layer 250 includes a plurality of pixel holes 2502 in an array. Each pixel hole 2502 receives an organic light emitter 2522. Each of the organic light emitters 2522 is connected to one thin film transistor 248. The common electrode layer 260 is disposed on a side of the pixel definition layer 250 away from the driving circuit layer 240. The second substrate 280 is disposed on a side of the common electrode layer 260 away from the pixel definition layer 250. A capping layer 270 is disposed between the second substrate 280 and the common electrode layer 260.

The display apparatus 140 includes a plurality of light shielding blocks 272. In some alternative embodiments, the plurality of light shielding blocks 272 can be connected together to be one piece of light shielding block. The light shielding blocks 272 are disposed between the second substrate 280 and the organic light emitters 2522. The light shielding blocks 272 are partially corresponding to the thin film transistors 248. In some embodiments, each of the light shielding blocks 272 is at least partially corresponding to one thin film transistor 248 in a stacked direction of the substrate 220, the driving circuit layer 240 and the pixel definition layer 250. In some embodiments, the light shielding blocks 272 are at least partially corresponding to the thin film transistors 248 one-by-one in a stacked direction of the substrate 220, the driving circuit layer 240 and the pixel definition layer 250.

The camera 160 is at least partially corresponding to the pixel holes 2502 and acquires images through the display apparatus 140. The light shielding blocks 272 are configured to shield ambient light irradiating to the thin film transistors 248 when the camera acquires images.

The light shielding blocks 272 may be of black or dark-colored material. The light shielding blocks 272 may be configured to shield light entering the display apparatus 140 and irradiating to the thin film transistors 248. It can prevent the light from entering the display apparatus 140 and from being reflected or refracted by the thin film transistors 248, thereby preventing stray light from interfering with imaging and improving the quality of imaging of camera which is under the display screen.

In some embodiments, the light shielding blocks 272 are disposed in the capping layer 270.

In order to shield the ambient light irradiating to the thin film transistor 248 better, the light shielding blocks 272 need to be disposed between the thin film transistor 248 and the second substrate 280. The light shielding blocks 272 are disposed in the optical path where the ambient light irradiates the thin film transistor 248 perpendicularly. And it is also necessary to minimize the effect on the display apparatus 140, therefore avoiding the organic light emitter 2522. Specifically, the light shielding blocks 272 are disposed on the capping layer 270, which can shield the ambient light irradiating to the thin film transistor 248 without affecting the display function of the display apparatus 140.

In some embodiments, the capping layer 270 has a plurality of first through holes 2706. Each of the first through holes 2706 is disposed corresponding to one thin film transistor 248, and each of the light shielding blocks 272 are disposed in corresponding one of the first through holes 2706. Each of the light shielding blocks 272 are corresponding to corresponding one of the thin film transistors 248 in a stacked direction of the substrate 220, the driving circuit layer 240 and the pixel definition layer 250. The greater thickness of the light shield block 272 is, the better the shielding effect is achieved. The light shielding blocks 272 are disposed in the first through hole 2706, which can maximize the thickness of the light shielding blocks 272, thereby achieving a better light-shielding effect.

Figure 3:
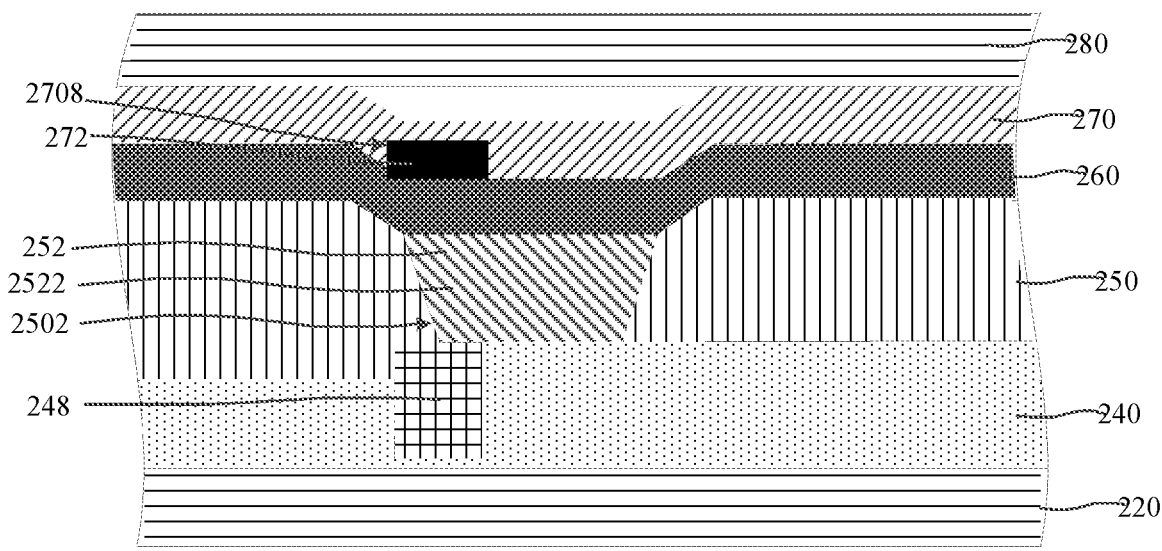
FIG. 3 is a second structure schematic diagram of a display apparatus according to an embodiment of the disclosure.

FIG. 3 is a second structure schematic diagram of the display apparatus 140 of the electronic device 100 in FIG. 1. The capping layer 270 has a plurality of first grooves 2708. Each of the first grooves 2708 is disposed corresponding to one thin film transistor 248 in a stacked direction of the substrate 220, the driving circuit layer 240 and the pixel definition layer 250. The opening of each of the first grooves 2708 faces the first substrate 220 or the second substrate 280. The light shielding blocks 272 are correspondingly disposed in the first grooves 2708. The light shielding blocks 272 may be disposed first and then the capping layer 270, or alternatively, the capping layer 270 may be disposed first and then the light shielding blocks 272.

A plurality of first grooves 2708 may be formed on the capping layer 270. The openings of the first grooves 2708 face the first substrate 220 or the second substrate 280. The light shielding blocks 272 may be disposed in the first grooves.

In the embodiments, the opening of the first groove 2708 faces to the second substrate 280. The light shielding blocks 272 just fill up the first groove 2708. The surface of the light shielding blocks 272 facing to the second substrate 280 and the surface of the capping layer 270 facing to the second substrate 280 is flush. The light shielding blocks 272 may not fill up the first groove 2708. The surface of the light shielding blocks 272 facing to the second substrate 280 is lower than the surface of the capping layer 270 facing to the second substrate 280.

Figure 4:
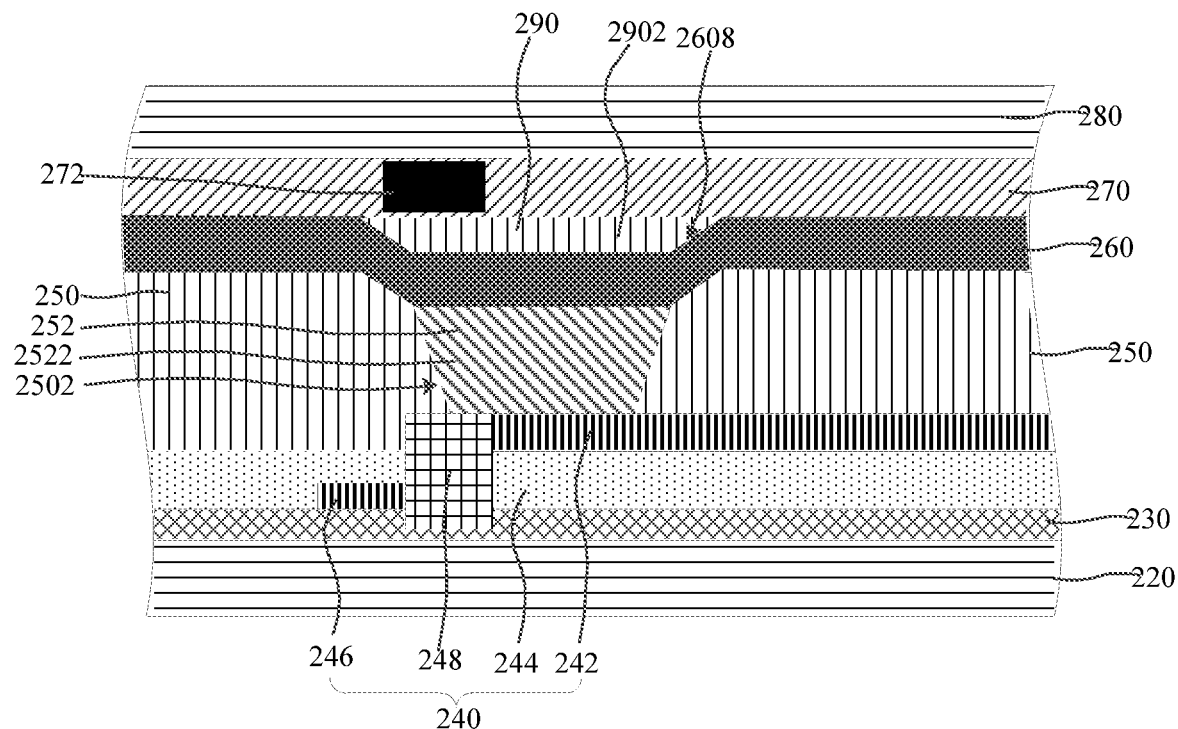
FIG. 4 is a third structure schematic diagram of the display apparatus according to an embodiment of the disclosure.

FIG. 4 is a third structure schematic diagram of a display apparatus according to an embodiment of the disclosure. The display apparatus 140 further includes a filling layer 290. The filling layer 290 is disposed on a side of the common electrode layer 260 away from the pixel definition layer 250, and the filling layer 290 comprises a plurality of filling bodies 2902. Each of the filling bodies 2902 is disposed corresponding to one pixel hole 2502. The difference of a refractive index between the pixel definition layer 250 and the filling layer 290 is smaller than the difference of a refractive index between the pixel definition layer 250 and a vacuum.

In some embodiments, when the optical signal goes through the display apparatus 140, the optical signal going through a first area of the display apparatus 140 has a first optical path, and the optical signal going through a second area of the display apparatus 140 has a second light path. The first area of the display apparatus 140 corresponds to the pixel hole 2502. The second area of the display apparatus 140 corresponds to the outside area of the pixel hole 2502 in the pixel definition layer 250. There is an optical path difference between the first optical path and the second optical path. The common electrode layer 260 covers the organic light emitter 2522 and the pixel definition layer 250. The thickness of all parts of the common electrode layer 260 is approximately the same, and the common electrode layer 260 has no influence or little influence on the optical path difference. Because the optical parameters of the pixel definition layer 250 and the organic light emitter 2522 are different, outside area of the pixel hole 2502 in the pixel definition layer 250 and the organic light emitter 2522 corresponding to the pixel holes 2502 have a greater influence on the optical path difference.

In some embodiments, due to the manufacturing process of the display apparatus 140, the display apparatus 140 defines a gap corresponding to the pixel holes 2502. The gap is located on the side of the common electrode layer 260 away from the pixel hole 2502. There is no gap in the display apparatus 140 corresponding to outside area of the pixel holes 2502 in the pixel definition layer 250. The gap has a great influence on the optical path difference.

The difference in light parameters between the vacuum in the gap and the pixel definition layer 250 is great. In some embodiments, a filling body 2902 is fit in the gap, and the difference of the refractive index between the pixel definition layer 250 and the filling body 2902 is smaller than the difference of the refractive index of the pixel definition layer 250 and the vacuum. It will improve the optical path difference between the first optical path and the second optical path, thereby improving the imaging quality of the camera 160 capturing the optical signal through the display apparatus 140.

In some embodiments, as illustrated in FIG. 4, the common electrode layer 260 defines a plurality of second grooves 2608. The openings of the plurality of second grooves 2608 face the second substrate 280. Each of the second grooves 2608 faces one pixel hole 2502. Each of the filling bodies 2902 is disposed in one second groove 2608.

Figure 5:
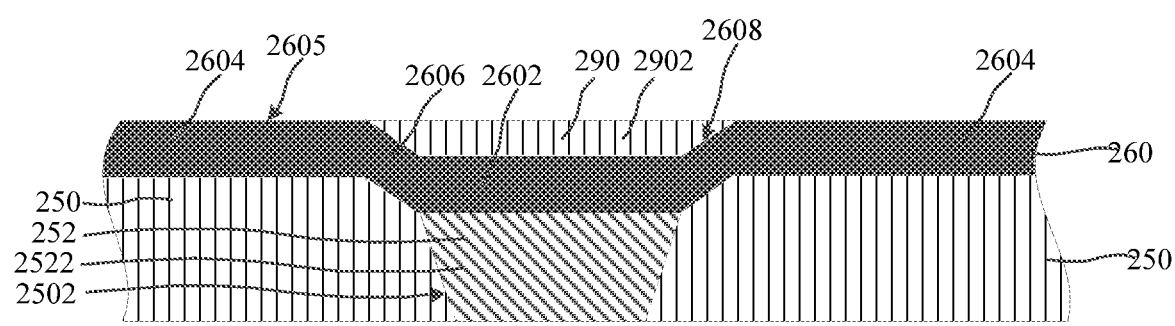
FIG. 5 is a fourth structure schematic diagram of a display apparatus according to an embodiment of the disclosure.

FIG. 5 is a fourth structure schematic diagram of a display apparatus according to an embodiment of the disclosure. The common electrode layer 260 includes a first electrode portion 2602, a second electrode portion 2604, and a third electrode portion 2606. The first electrode portion 2602 is disposed in the pixel hole 2502 and covers the organic light emitter 2522. The second electrode portion 2604 covers the pixel definition layer 250. The first electrode portion 2602 and the second electrode portion 2604 are connected by the third electrode portion 2606. The first electrode portion 2602 and the third electrode portion 2606 cooperatively define a second groove 2608. The filling body 2902 is disposed in the second groove 2608.

The organic light emitter 2522 is disposed in the pixel hole 2502 and the organic light emitter 2522 does not fill up the pixel hole 2502. The first electrode portion 2602 of the common electrode layer 260 is disposed in the pixel hole 2502. The second electrode portion 2604 of the common electrode layer 260 covers the pixel definition layer 250. The first electrode portion 2602 and the second electrode portion 2604 have a height difference. The first electrode portion 2602 and the third electrode portion 2606 can cooperatively defines a second groove 2608. The filling body 2902 is correspondingly disposed in the second groove 2608.

In some embodiments, the second electrode portion 2604 includes a first surface 2605 away from the pixel definition layer 250. The surface of the filling body 2902 away from the organic light emitter 2522 is flush with the first surface 2605.

The capping layer 270 covers the common electrode layer 260, and the capping layer 270 may be a flat layer.

In some embodiments, the display apparatus 140 has a first optical path perpendicular to the direction of the first substrate 220 and corresponding to the area of the pixel hole 2502, the display apparatus 140 has a second optical path perpendicular to the direction of the first substrate 220 and corresponding to outside area of the pixel hole 2502 in the pixel definition layer 250. The first optical path can be equal to the second optical path.

The first optical path is the optical path of the optical signal going through the display apparatus 140 from the position corresponding to the pixel hole 2502 in a direction perpendicular to the first substrate 220. The first optical path may be the sum of products of the corresponding thickness and refractive index of each layer in the second substrate 280, the capping layer 270, the filling layer 290, the common electrode layer 260, the organic light emitting layer 252, the driving circuit layer 240, and the first substrate 220.

The second optical path is the optical path of the optical signal going through the display apparatus 140 from the position corresponding to outside area of the pixel hole 2502 in a direction perpendicular to the first substrate 220. The second optical path may be the sum of the products of the corresponding thickness and refractive index of each layer in the second substrate 280, the capping layer 270, the common electrode layer 260, the pixel definition layer 250, the driving circuit layer 240, and the first substrate 220.

Because each layer of the second substrate 280, the capping layer 270, the common electrode layer 260, the driving circuit layer 240, and the first substrate 220 covers the entire layer, and the thickness of each layer is approximately the same, the optical path difference between the first optical path and the second optical path in the second substrate 280, the capping layer 270, the common electrode layer 260, driving circuit layer 240, and the first substrate 220 can be ignored.

In some embodiments, the first optical path can also be approximately equal to the second optical path.

In some embodiments, the filling layer 290 further includes a connecting body, which covers the common electrode layer 260 and is connected to a plurality of filling bodies 2902.

The filling body 2902 is filled in the second groove 2608, and the connecting body can cover the entire layer. The connecting body covers the entire common electrode layer 260 and the filling body 2902. If the filling body 2902 just fills up the second groove 2608, the two corresponding surfaces of the connecting body are parallel.

In some embodiments, the second electrode portion 2604 includes a first surface away from the pixel definition layer 250, and the surface of the filling body 2902 away from the organic light emitter 2522 can be lower or higher than the first surface.

The surface of the filling body 2902 away from the organic light emitter 2522 may be lower or higher than the first surface of the first electrode portion, which matches the optical parameters of the filling body 2902. It will reduce the optical path difference between the first optical path and the second optical path.

Figure 6:
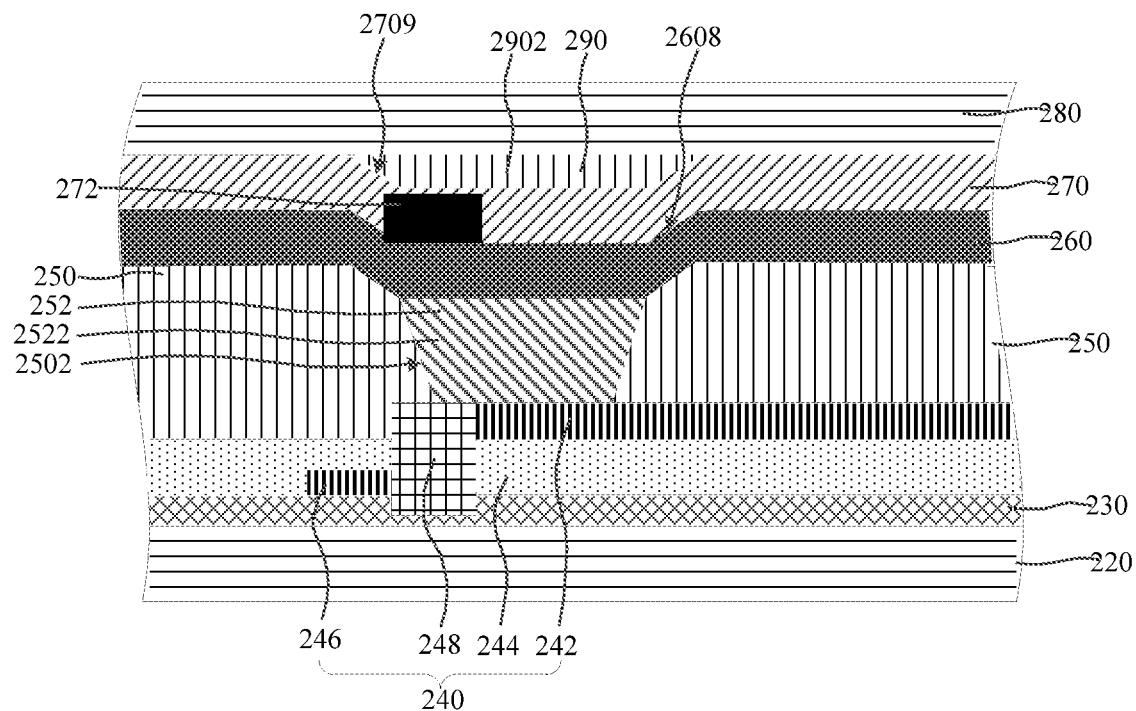
FIG. 6 is a fifth structure schematic diagram of a display apparatus according to an embodiment of the disclosure.

FIG. 6 is a fifth structure schematic diagram of a display apparatus according to an embodiment of the disclosure. The capping layer 270 has a plurality of third grooves 2709. The openings of the plurality of third grooves 2709 face the second substrate 280. Each of the third grooves 2709 is disposed corresponding to one pixel hole 2502. Each of the filling bodies 2902 is disposed in one third groove 2709.

Corresponding to the second groove 2608 of the common electrode layer 260, the capping layer 270 has a third groove 2709, and the filling body 2902 is disposed in the third groove 2709, which has little influence on the structure of the original display apparatus 140.

Figure 7:
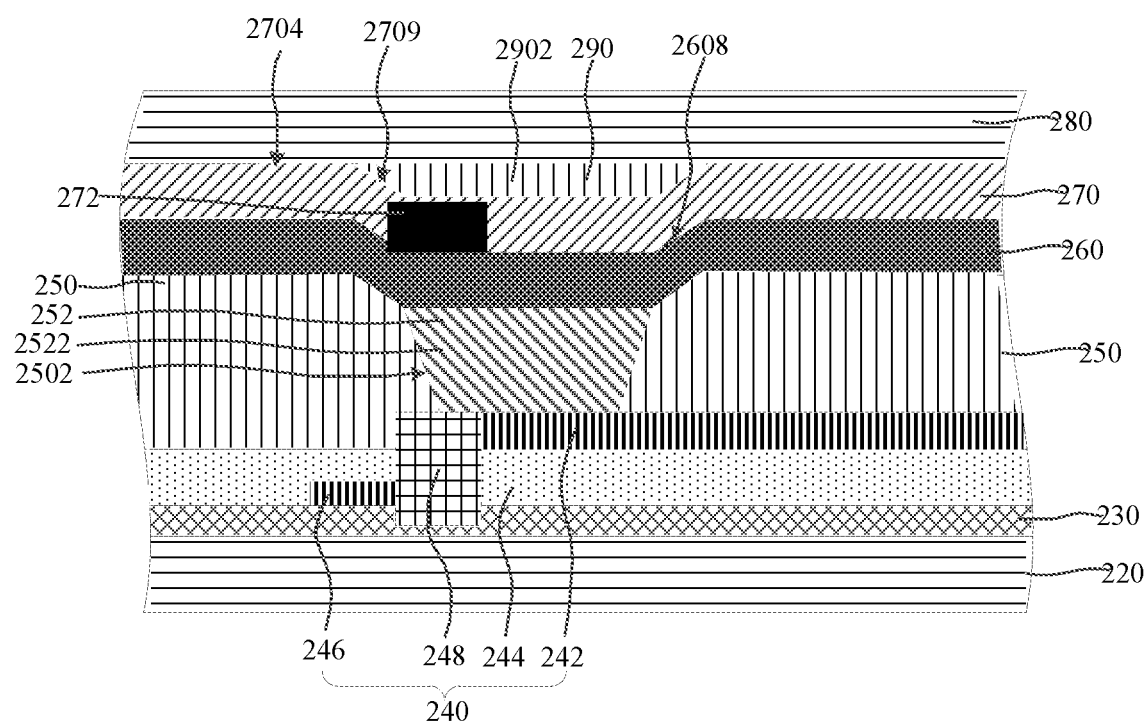
FIG. 7 is a sixth structure schematic diagram of a display apparatus according to an embodiment of the disclosure.

FIG. 7 is a sixth structure schematic diagram of a display apparatus according to an embodiment of the disclosure. The capping layer 270 includes a third surface 2704 away from the common electrode layer 260. The surface of the filling body 2902 away from the organic light emitter 2522 is flush with the third surface 2704.

The filling body 2902 can fill up the third groove 2709, which can be easier for other structures covering the capping layer 270 to implement and cover smoothly.

In some embodiments, the capping layer 270 includes a third surface 2704 away from the common electrode layer 260. The surface of the filling body 2902 away from the organic light emitter 2522 is lower than the third surface 2704.

The filling body 2902 can be filled in the third groove 2709, and the third groove 2709 may not be filled up based on its optical parameters which will not affect other structures covering the capping layer 270.

In some embodiments, the light shielding block 272 has a first projection on the first substrate 220. The thin film transistor 248 has a second projection on the first substrate 220. The second projection is within the first projection.

The second projection of the thin film transistor 248 on the first substrate 220 is within the first projection of the light shielding block 272 on the first substrate 220. The light shielding block 272 is directly above the thin film transistor 248 and the area of the light shielding block 272 is larger than the area of the thin film transistor 248. The light shielding block 272 can completely shield the light irradiating perpendicularly to the thin film transistor 248.

In some embodiments, the driving circuit layer 240 of the display apparatus disposed on the first substrate 220 further includes a first anode metal layer 242, a planarization layer 244, and a second anode metal layer 246. The first anode metal layer 242, the second anode metal layer 246 and the organic light emitting layer 252 are connected to different poles of the thin film transistor 248 separately. The first anode metal layer 242 and the second anode metal layer 246 control whether to provide a positive electrode signal to the organic light emitting layer 252 by the thin film transistor 248.

After providing the positive signal to the organic light emitting layer 252, the negative electrode from the common electrode layer 260 can be used to control whether the organic light emitting layer 252 emits light.

In some embodiments, the display apparatus further includes a thin film 230 disposed between the first substrate 220 and the driving circuit layer 240. The thin film 230 may be made of SiNx or SiO2.

Figure 8:
FIG. 8 is a second structure schematic diagram of an electronic device according to an embodiment of the disclosure.

FIG. 8 is a second structure schematic diagram of an electronic device according to an embodiment of the disclosure. In some embodiments, the electronic device 100 further comprises a processor 180. Both the display apparatus 140 and the camera 160 are electrically connected to the processor 180.

When receiving a shooting instruction, the processor 180 controls the display apparatus 140 to turn off the display, and controls the camera 160 to acquire images through the display apparatus 140. When receiving an image display instruction, the processor 180 controls the display apparatus 140 to display the images.

The processor 180 may control the display apparatus 140 based on the shooting requirements of the camera 160. When an image needs to be captured by the camera 160, that is when a shooting instruction is received, the display apparatus 140 is controlled to turn off the display, and the camera 160 acquires images through the display apparatus 140 with the display turned off and without being affected by the display content of the display apparatus 140. For example, the self-luminous of the organic light emitter 2522 in the display apparatus 140 may interfere with imaging. Therefore, before the camera 160 acquires images through the display apparatus 140, the display apparatus 140 can be controlled to turn off the display. When the display apparatus 140 is going to display image, that is, when the image display instruction is received, the processor 180 controls the display apparatus 140 to display the image.

Referring to FIG. 2 and FIG. 8, this embodiment provides a display apparatus 140, which includes a first substrate 220, a pixel definition layer 250, a common electrode layer 260, a capping layer 270 and a second substrate 280.

The driving circuit layer 240 is disposed on the first substrate 220, and the driving circuit layer 240 includes a plurality of thin film transistors 248 in an array.

The pixel definition layer 250 is disposed on a side of the driving circuit layer 240 away from the first substrate 220. The pixel definition layer 250 includes a plurality of pixel holes 2502 in an array. Each pixel hole 2502 is disposed with an organic light emitter 2522. Each of the organic light emitters 2522 is connected to one thin film transistor 248. The common electrode layer 260 is disposed on a side of the pixel definition layer 250 away from the driving circuit layer 240. The second substrate 280 is disposed on a side of the common electrode layer 260 away from the pixel definition layer 250, and a capping layer 270 is disposed between the second substrate 280 and the common electrode layer 260.

A plurality of light shielding blocks 272 are disposed between the second substrate 280 and each of the organic light emitters 2522. In some embodiments, the light shielding blocks 272 are partially corresponding to the thin film transistors 248. In some embodiments, each of light shielding blocks 272 is at least partially disposed corresponding to corresponding one thin film transistor 248.

The light shielding blocks 272 may be black or dark-colored material. The light shielding blocks 272 may be configured to shield light entering the display apparatus 140 and irradiating to the thin film transistor 248. The light shielding blocks 272 can prevent the light from entering the display apparatus 140 and from being reflected and/or refracted by the thin film transistor 248, thereby preventing stray light from interfering with imaging. For example, the interfering with imaging which is caused by, when an image is displayed by the organic light emitter 2522 of the display apparatus, the light entering the display apparatus are emitted or refracted by the thin film transistor 248.

The display apparatus may adopt the structure of the display apparatus in any of above embodiments and which are not described herein.

Figure 9:
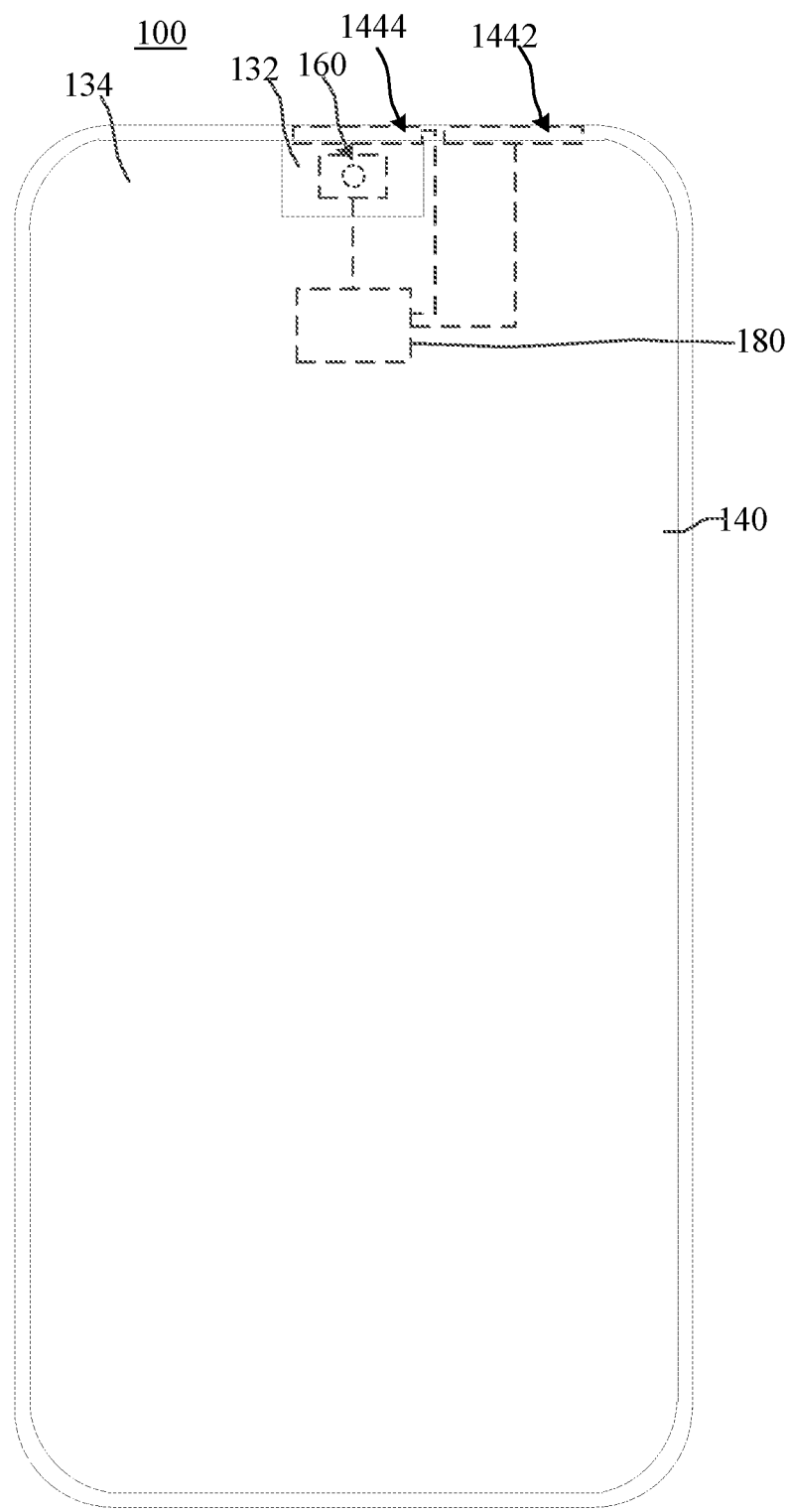
FIG. 9 is a third structure schematic diagram of an electronic device according to an embodiment of the disclosure.

FIG. 9 is a third structure schematic diagram of an electronic device according to an embodiment of the disclosure. In some embodiments, the display apparatus 140 includes a light transmitting area 132 and a body area 134. The area of the light transmitting area 132 is smaller than the area of the body area 134. The light transmittance of the light transmitting area 132 is greater than the light transmittance of the body area 134. The light transmitting area 132 is at least partially surrounded by the body area 134. In the light transmitting area 132, a plurality of light shielding blocks 272 are disposed between the second substrate 280 and the organic light emitters 2522. Each of the light shielding blocks 272 is at least partially disposed corresponding to a corresponding one of the thin film transistors 248. In some alternative embodiments, the plurality of light shielding blocks 272 can connect together to be one-piece light shielding block.

The body area 134 includes the plurality of first thin film transistors. The light transmitting area 132 includes the plurality of second thin film transistors and at least one light shielding block 272. The distribution density of the second thin film transistors in the light transmitting area 132 is less than the distribution density of the plurality of first thin film transistors in the body area 134. The light shielding block 272 is at least partially corresponding to one of the second thin film transistors.

The light transmitting area 132 is connected to a first driving circuit 1444. The body area 134 is connected to a second driving circuit 1442. The first driving circuit 1444 drives the light transmitting area 132 of the display apparatus 140. The second driving circuit 1442 drives the body area 134 of the display apparatus 140. The first driving circuit 1442 and the second driving circuit 1444 drive in cooperation. The light transmitting area 132 and the body area 134 can cooperatively display the same image. For example, the light transmitting area 132 displays a part of the image, and the body area 134 displays the remaining part of the image.

When acquiring an image through the light transmitting area 132, the first driving circuit 1444 drives the light transmitting area 132 to turn off the display, and the second driving circuit 1442 can continue to drive the body area 134 to display images. The camera captures outside optical signal by turning off the display of the light transmitting area 132 and obtains images based on the optical signal even the body area is displaying images.

The camera is positioned corresponding to the light transmitting area. The camera is configured to receive light passing though the light transmitting area to acquire image.

The light shielding blocks are configured to shield ambient light irradiating toward the thin film transistors when the camera acquires image.

In some embodiments, referring to FIG. 2, the distribution density of the pixel holes 2502 in the light transmitting area 132 is less than the distribution density of the pixel holes 2502 in the body area 134.

Figure 10:
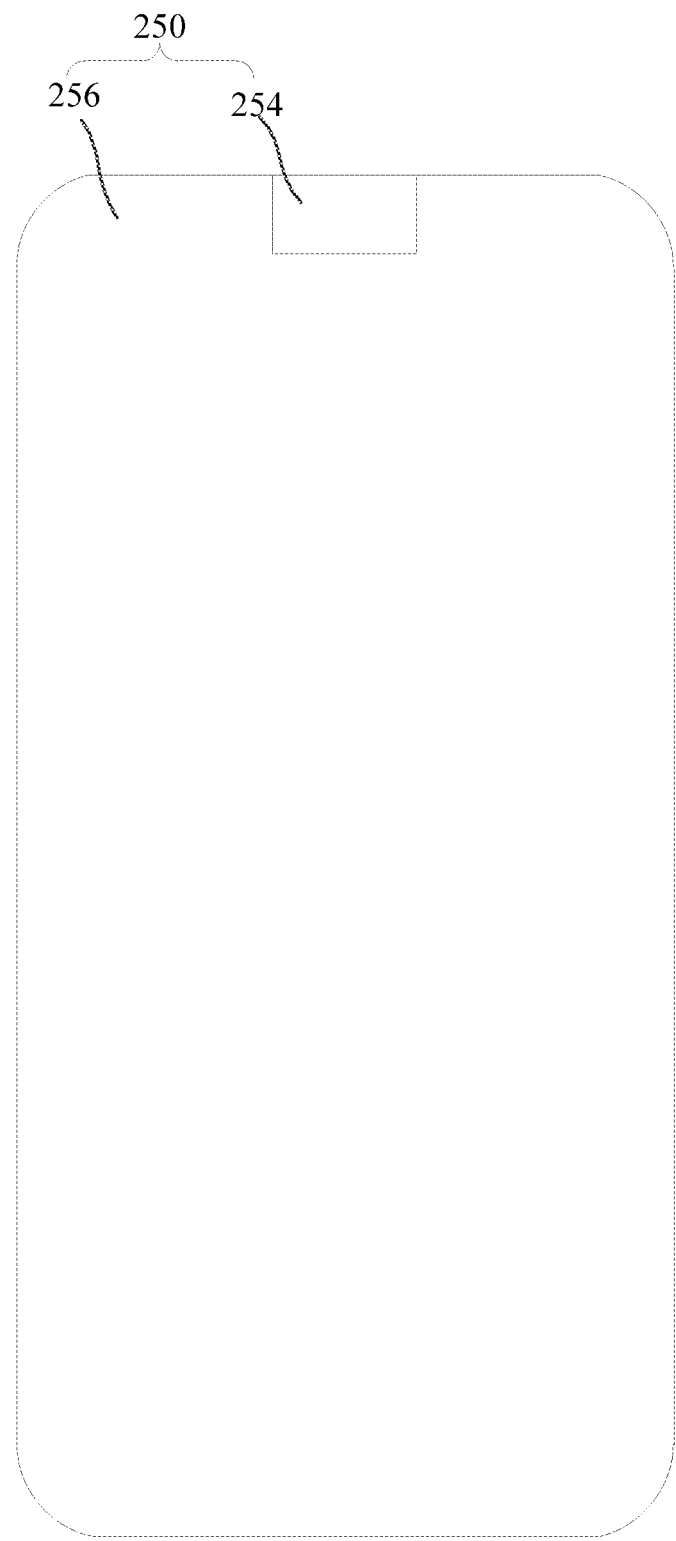
FIG. 10 is a structural schematic diagram of a pixel definition layer of a display apparatus according to an embodiment of the disclosure.

FIG. 10 is a structural schematic diagram of a pixel definition layer of a display apparatus according to an embodiment of the disclosure. In some embodiments, the pixel definition layer 250 includes a first part 254 and a second part 256. The first part 254 corresponds to the light transmitting area of the display apparatus 140, and the second part 256 corresponds to the body area of the display apparatus 140. The area of the first part 254 is smaller than the area of the second part 256. The light transmittance of the first part 254 is greater than the light transmittance of the second part 256. The camera is configured to acquire images through the first part 254 of the display apparatus 140.

Correspondingly, the camera 160 can capture optical signals through the first part 254 of the display apparatus 140. The light transmittance of the display apparatus 140 corresponding to the first part 254 is greater than the light transmittance of the display apparatus corresponding to the second part 256. The distribution density of the organic light emitter 2522 corresponding to the first part 254 is smaller than the distribution density of the organic light emitter 2522 corresponding to the second part 256. The distribution density of the thin film transistor 248 corresponding to the first part 254 is less than the distribution density of the thin film transistor 248 corresponding to the second part 256. It will improve the light transmittance of the display apparatus corresponding to the first part 254.

In some embodiments, the distribution density of the organic light emitter 2522 of the first part 254 is smaller than the distribution density of the organic light emitter 2522 of the second part 256. The distance between two adjacent pixel holes 2502 of the first part 254 is greater than the distance between two adjacent pixel holes 2502 of the second part 256. The light transmittance of the pixel definition layer 250 is greater than the light transmittance of the organic light emitter 2522. The duty ratio of the organic light emitting layer of the first part 254 is smaller and the light transmittance of the first part 254 is greater than the light transmittance of the second part 256. Each organic light emitter 2522 is corresponding to one thin film transistor 248 one by one. The thin film transistor 248 is opaque. The distribution density of the organic light emitter 2522 of the first part 254 is smaller, and the distribution density of the corresponding thin film transistor 248 is also less than that of the second part 256. Therefore, the light transmittance of the first part 254 is greater than the light transmittance of the second part 256.

In some embodiments, the first part 254 is located at the end of the pixel definition layer 250. The first part 254 may be located at the top, bottom or side of the pixel definition layer 250. For example, the pixel definition layer 250 is rectangular, and the second part 256 is a rectangle with a notch, and the first part 254 is disposed in the notch. The notch may be disposed on the top edge. bottom edge, or side edge of the second part 256. The first part 254 can also be disposed in the middle of the pixel definition layer 250, and it can also be understood that the second part 256 has a through hole penetrating the second part 256 in the thickness direction, and the first part 254 is disposed in the through hole.

The difference between light transmitting area 132 and the body area 134 is mainly in the pixel definition layer 250. The light transmitting area 132 and the body area 134 may share the same first substrate 220, second substrate 280, and so on. The filling layer 290 may be disposed only in the light transmitting area 132, or may be disposed in the light transmitting area 132 and the body area 134.

Referring to FIG. 2, the driving circuit layer 240 corresponding to the first part 254 can be made of a material with high light transmittance, such as ITO, Nano silver, and so on. The driving circuit layer 240 corresponding to the second part 256 may be made of a material with high light transmittance, or may be made of a material with low light transmittance or opacity.

Figure 11:
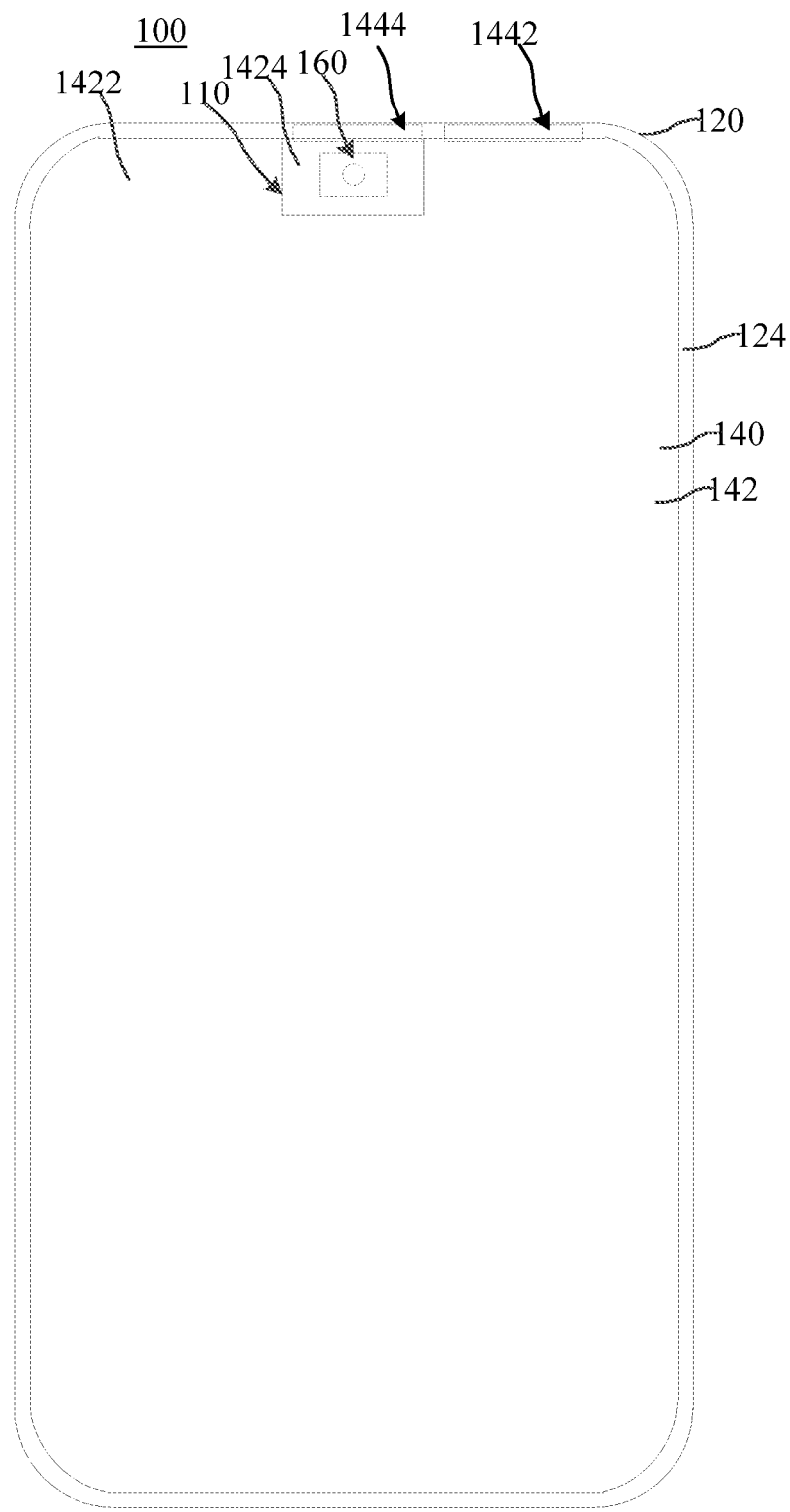
FIG. 11 is a fourth structure schematic diagram of an electronic device according to an embodiment of the disclosure.

FIG. 11 is a fourth structure schematic diagram of an electronic device according to an embodiment of the disclosure. In some embodiments, the display apparatus 140 may include a first display panel 1422 and a second display panel 1424. The first display panel 1422 defines a notch 110. The notch 110 penetrates the first display panel 1422 in the thickness direction of the first display panel 1422. The first display panel 1422 is a normally displayed display panel. The second display panel 1424 is disposed in the notch 110. The second display panel 1424 corresponds to the light transmitting area 132 of the display apparatus 140, and the first display panel 1422 corresponds to the body area 134 of the display apparatus 140. The camera 160 can acquire images through the second display panel 1424.

The first display panel 1422 and the second display panel 1424 are two independent display panels. The first display panel 1422 and the second display panel 1424 are manufactured separately, and then put the second display panel 1424 into the notch 110 of the first display panel 1422.

In some embodiments, the first display panel 1422 is connected to the second drive circuit 1442, the second display panel 1424 is connected to the first drive circuit 1444. The first drive circuit 1444 drives the second display panel 1424, and the second drive circuit 1442 drives the first display panel 1422. The first driving circuit 1442 and the second driving circuit 1444 drive in cooperation. The first display panel 1422 and the second display panel 1424 can cooperatively display the same image. For example, the first display panel 1422 can display a part of the image, and the second display panel 1424 can display the remaining part of the image.

When acquiring an image through the second display panel 1424, the first driving circuit 1444 drives the second display panel 1424 to turn off the display, and the second driving circuit 1442 can continue to drive the first display panel 1422 to display images. The camera 160 captures outside optical signal by turning off the displaying display panel 1424 and obtains images based on the optical signal even the first display panel 1422 is displaying images.

Also disclosed is an electronic device 100, which includes a camera 160 and a display apparatus 140. The display apparatus 140 may be the display apparatus described in any of the above embodiments. The camera 160 is at least partially disposed corresponding to the light transmitting area 132 and acquires images through the light transmitting area 132. The light shielding blocks 272 are configured to shield the ambient light irradiated to the thin film transistor 248 when the camera 160 acquires images.

In some embodiments, the electronic device 100 further includes a processor 180, and both the display apparatus 140 and the camera 160 are electrically connected to the processor 180. When receiving the shooting instruction, the processor 180 controls the light transmitting area 132 to turn off the display, and controls the camera 160 to acquire images through the light transmitting area 132. When the shooting instruction is not received and the image display instruction is received, the processor 180 controls the light transmitting area 132 and the body area 134 to cooperatively display the image.

Although the electronic device and the display apparatus have been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. An electronic device, comprising:
    a display apparatus comprising:
        a first substrate,
        a driving circuit layer positioned on the first substrate, and the driving circuit layer comprising a plurality of thin film transistors in an array;
        a pixel definition layer disposed on a side of the driving circuit layer away from the first substrate, the pixel definition layer comprising a plurality of pixel holes in an array, and each pixel hole receiving an organic light emitter and each of the organic light emitters correspondingly being connected to one thin film transistor;
        a common electrode layer disposed on a side of the pixel definition layer away from the driving circuit layer;
        a second substrate disposed on a side of the common electrode layer away from the pixel definition layer; and
        a capping layer disposed between the second substrate and the common electrode layer;
    a camera; and
    wherein at least a light shielding block is disposed between the second substrate and the organic light emitters, the light shielding block is at least partially corresponding to one of the thin film transistors the camera is at least partially positioned corresponding to the plurality of pixel holes and is configured to acquire images through the display apparatus and the light shielding block is configured to shield ambient light irradiating to the thin film transistors when the camera acquires an image;
    wherein a face of the organic light emitter away from the light shielding block is in contact with a face of the thin film transistor away from the first substrate; and
    wherein an orthogonal projection of the entire thin film transistor on the first substrate is within an orthogonal projection of the entire light shielding block on the first substrate.

2. The electronic device of claim 1, wherein the light shielding block is disposed in the capping layer.

3. The electronic device of claim 2, wherein the capping layer has a plurality of first through holes, and each of the first through holes is disposed corresponding to one thin film transistor, the light shielding block is disposed in corresponding one of the plurality of first through holes; or wherein the capping layer has a plurality of first grooves and each of the first grooves is disposed corresponding to one thin film transistor and the opening of each of the first grooves faces the first substrate or the second substrate, the light shielding block is disposed in corresponding one of the plurality of the first grooves.

4. The electronic device of claim 1, wherein the display apparatus further comprises a filling layer disposed on a side of the common electrode layer away from the pixel definition layer, and the filling layer comprises a plurality of filling bodies, and each of the filling bodies is disposed corresponding to one pixel hole, and the difference of a refractive index of the pixel definition layer and the filling layer is smaller than that of the pixel definition layer and the vacuum.

5. The electronic device of claim 4, wherein the common electrode layer has a plurality of second grooves, the openings of the plurality of second grooves face the second substrate, and each of the second grooves is disposed corresponding to one pixel hole, and each of the filling bodies is disposed in corresponding one of the second groove.

6. The electronic device of claim 4, wherein the capping layer has a plurality of third grooves, and the openings of the plurality of third grooves face the second substrate, and each of the third grooves is disposed corresponding to corresponding one of the pixel holes, and each of the filling bodies is disposed in corresponding one of the third grooves.

7. The electronic device of claim 1, the electronic device further comprises a processor, and both the display apparatus and the camera are electrically connected to the processor;
    wherein when receiving a shooting instruction, the processor controls the display apparatus to turn off image display and controls the camera to acquire images through the display apparatus; and
    wherein when receiving an image display instruction, the processor controls the display apparatus to display the image.

8. A display apparatus, comprising:
    a first substrate,
    a driving circuit layer positioned on the first substrate, and the driving circuit layer comprising a plurality of thin film transistors in an array;
    a pixel definition layer disposed on a side of the driving circuit layer away from the first substrate and comprising a plurality of pixel holes in an array, and each pixel hole receiving an organic light emitter, and each of the organic light emitters being connected to one of the thin film transistors;
    a common electrode layer disposed on a side of the pixel definition layer away from the driving circuit layer; and
    a second substrate disposed on a side of the common electrode layer away from the pixel definition layer,
    a capping layer disposed between the second substrate and the common electrode layer;
    wherein, the display apparatus defining a body area and a light transmitting area, and the light transmitting area is at least partially surrounded by the body area, and in the light transmitting area, a plurality of light shielding blocks are disposed between the second substrate and one of the organic light emitters, and the light shielding blocks are at least partially corresponding to the thin film transistors;
    wherein a face of the organic light emitter away from the light shielding block is in contact with a face of the thin film transistor away from the first substrate; and wherein an orthogonal projection of the entire thin film transistor on the first substrate is within an orthogonal projection of the entire light shielding block on the first substrate.

9. The display apparatus of claim 8, wherein the light shielding blocks are disposed on the capping layer.

10. The display apparatus of claim 9, wherein the capping layer has a plurality of first through holes, each of the first through holes is disposed corresponding to one thin film transistor, and each of the light shielding blocks are disposed in corresponding one of the first through holes; or
wherein the capping layer has a plurality of first grooves, each of the first grooves is disposed corresponding to corresponding one of the thin film transistors, and the opening of each of the first grooves faces the first substrate or the second substrate, and the light shielding blocks are disposed in the first grooves correspondingly.

11. The display apparatus of claim 8, wherein the display apparatus further comprises a filling layer disposed on a side of the common electrode layer away from the pixel definition layer, and the filling layer comprises a plurality of filling bodies, and each of the filling bodies is disposed corresponding to one pixel hole, and the difference of a refractive index of the pixel definition layer and the filling layer is smaller than that of the pixel definition layer and the vacuum.

12. The display apparatus of claim 11, wherein the common electrode layer has a plurality of second grooves, the openings of the plurality of second grooves face the second substrate, and each of the second grooves is disposed corresponding to corresponding one of the pixel holes, and each of the filling bodies is disposed in corresponding one of the second grooves.

13. The display apparatus of claim 11, wherein the capping layer has a plurality of third grooves, and the openings of the plurality of third grooves face the second substrate, and each of the third grooves is disposed corresponding to corresponding one of the pixel holes, and each of the filling bodies is disposed in corresponding one of the third grooves.

14. The display apparatus of claim 8, wherein the area of the light transmitting area is smaller than the area of the body area, and the light transmittance of the light transmitting area is greater than that of the body area.

15. The display apparatus of claim 14, wherein the distribution density of the pixel holes in the light transmitting area is less than that in the body area.

16. The display apparatus of claim 15, wherein the display apparatus comprises a first display panel and a second display panel, the first display panel is disposed with a notch, and the notch penetrates the first display panel in the thickness direction of the first display panel, and the second display panel is disposed in the notch, and the first display panel is the body area and the second display panel is the light transmitting area.

17. An electronic device, comprising:
a display apparatus comprising:
a first substrate;
a driving circuit layer positioned on the first substrate;
a pixel definition layer disposed on a side of the driving circuit layer away from the first substrate, the pixel definition layer comprising a plurality of pixel holes in an array, and each pixel hole receiving an organic light emitter;
a common electrode layer disposed on a side of the pixel definition layer away from the driving circuit layer;
a second substrate disposed on a side of the common electrode layer away from the pixel definition layer;
a body area comprising a plurality of first thin film transistors;
a light transmitting area comprising a plurality of second thin film transistors and at least a light shielding block, the distribution density of the second thin film transistors in the light transmitting area being less than that of the plurality of first thin film transistors in the body area, the light shielding block being at least partially corresponding to one of the second thin film transistors, and in the light transmitting area, the light shielding block is disposed between the second substrate and the organic light emitter;
a camera positioned corresponding to the light transmitting area, the camera being configured to receive light passing though the light transmitting area to acquire image;
wherein the light shielding block is configured to shield ambient light irradiating toward the thin film transistor when the camera acquires an image;
wherein a face of the organic light emitter away from the light shielding block is in contact with a face of the second thin film transistor away from the first substrate; and
wherein an orthogonal projection of the entire thin film transistor on the first substrate is within an orthogonal projection of the entire light shielding block on the first substrate.

18. The electronic device of claim 17 further comprises a processor, wherein both the display apparatus and the camera are electrically connected to the processor;
wherein when receiving a shooting instruction, the processor controls the light transmitting area to turn off image display, and controls the camera to acquire images through the light transmitting area; and
wherein when the shooting instruction is not received and an image display instruction is received, the processor controls the light transmitting area and the body area to cooperatively display the image.

* * * * *